United States Patent [19]
Lunz et al.

[11] Patent Number: 6,097,303
[45] Date of Patent: Aug. 1, 2000

[54] MODULAR INPUT/OUTPUT SYSTEM WITH REDUNDANCY AND TESTING

[75] Inventors: Kenneth G. Lunz, Allison Park; Daniel Louis Simon, Glenshaw, both of Pa.

[73] Assignee: Westinghouse Process Control, Inc., Pittsburgh, Pa.

[21] Appl. No.: 08/846,400

[22] Filed: Apr. 30, 1997

[51] Int. Cl.⁷ ................................................. H05K 7/14
[52] U.S. Cl. ...................... 340/825; 361/683; 361/686; 361/733; 439/61
[58] Field of Search .............................. 340/825, 825.01, 340/825.22, 825.23, 825.17; 361/683, 733, 686; 714/10, 11, 13, 30; 364/186, 187; 439/49

[56] References Cited

U.S. PATENT DOCUMENTS

| | | | |
|---|---|---|---|
| 4,574,068 | 3/1986 | Hill et al. | 376/259 |
| 4,774,510 | 9/1988 | Steinke | 340/825.17 |
| 5,159,534 | 10/1992 | Hudson et al. | 361/683 |
| 5,202,822 | 4/1993 | McLaughlin et al. | 364/187 |
| 5,210,756 | 5/1993 | Kummer et al. | 714/10 |
| 5,472,347 | 12/1995 | Nordenstrom et al. | 439/61 |

FOREIGN PATENT DOCUMENTS

0489163A1  5/1991  European Pat. Off. ......... H05K 1/11

*Primary Examiner*—Edwin C Holloway, III
*Attorney, Agent, or Firm*—Marshall, O'Toole, Gerstein, Murray & Borun

[57] ABSTRACT

A modular input/output (I/O) system for field wiring includes a plurality of base units into which electronics modules providing appropriate signal processing are plugged. A backplane in each base unit provides leads between the electronics module and associated terminals to which the field wiring is connected and also hosts a communications bus through which the electronics modules on serially connected base members communicate with a controller. Switching modules plugged into some of the base members selectively switch field signals applied to terminals for an associated electronics module to another electronics module for redundancy, or switch test signals into the associated electronics module in place of the field wiring signals. The test signals are generated by yet another of the electronics modules while still another electronics module generates control signals for the switching modules.

7 Claims, 7 Drawing Sheets

MODULAR INPUT/OUTPUT SYSTEM WITH REDUNDANCY AND TESTING

Commonly owned, concurrently filed U.S. patent application entitled: MODULAR INPUT/OUTPUT SYSTEM WITH FLEXIBLE INTERFACE WITH FIELD WIRING and identified by Ser. No. 08/846,943.

Commonly owned, concurrently filed U.S. patent application entitled: MODULAR I/O SYSTEM WITH TWO-WAY CONNECTORS BETWEEN UNITS AND A COMMON LOCK FOR MULTIPLE PLUG-IN MODULES and identified by Ser. No. 08/846,946.

BACKGROUND OF THE INVENTION

1. Field of the Invention

This invention relates to input/output apparatus for interfacing field wiring with an electronic control or monitoring system. More particularly, it relates to a modular system with redundancy and a built-in test capability.

2. Background Information

Electronic control systems and monitoring systems such as process controls systems require communication with the outside world. This includes receiving inputs such as commands and process conditions provided by various sensors, transducers and/or contacts, and generating output such as control signals, status and results. This interaction is provided by input/output (I/O) hardware or firmware. The signals pass through the I/O can be analog or digital. Typically, the I/O includes signal processing circuitry which, for example, can limit the range of analog signals, provide filtering, amplification or attenuation, surge protection, isolation, pulse shaping for digital signals, analog to digital or digital-to-analog conversion and other signal conditioning.

Process control and monitoring systems for high integrity applications often require capabilities such as redundancy and on-line testability to ensure high reliability and availability. I/O redundancy requires the capability to diagnose that a problem has occurred with an I/O signal and then to be able to switch the field connections to back-up I/O circuitry of the same type for signal processing. On-line testability functions require the capability to disconnect the field connections from an I/O circuit and substitute simulated test signals. Such redundancy and testing capabilities are commonly required in nuclear and chemical processing industries. These functions typically add significant cost to I/O sub-systems and require specialized hardware and software.

There is a need for improved I/O systems for field wiring, particularly more cost-effective arrangements for implementing redundancy and testability functions.

SUMMARY OF THE INVENTION

This need and others are satisfied by the invention which is directed to a modular input/output (I/O) system providing modular redundancy and test functions. More particularly, the invention is directed to a modular I/O system which includes a plurality of electronics module mounted in bases, terminal means associated with each module, including terminals mounted on the bases to which the field wiring can be connected, and electrical conductors in the bases connecting the electronics module to the associated terminal means. The modular system further includes a plug-in personality or switching module associated with at least one of the electronics module. The switching module has switching means connecting with the electrical conductors in the base for effecting selectable connections between the at least one electronics module and the terminal means. One of the electronics module is a control module which generates a control signal controlling the switch means of the switching module for effecting the selectable connections for the at least one electronics module.

In accordance with one aspect of the invention, a second electronics module is provided which is redundant to the first electronics module. Transfer means connect the terminal means associated with the first electronics module with the terminal means of the second electronics module. The switching module associated with the first electronics module selectively switches the terminals associated with the first module to the first electronics module and alternatively to the second electronics module, so that the second electronics module can serve as a back-up for the first electronics module. The control electronics module provides the control signals for effecting switching of terminals associated with the first electronics module to those associated with the second electronics module. The second electronics module can provide redundancy for a number of first electronics modules, each of which has a switching module which selectively switches associated terminals to the second or back-up module so that the second module serves as a back-up for a number of electronics modules. Again, the control module provides the control signals effecting the switching which determines which one of the first modules will have its inputs switched to the back-up module.

In accordance with another aspect of the invention, one of the electronics modules is a test module which generates test signals. In this case, the terminal means associated with the first electronics module includes field terminals to which the field wiring is connected and test terminals to which the test signals are applied. The switching module associated with the first electronics module then selectively connects the first electronics module to the field terminals and alternatively to the test terminals. Again, another electronics module serves as a control module generating the control signal which controls the selective switching of the switching module. Also, the test module can generate test signals for a plurality of the electronics modules each of which has a switching module to alternatively connect the test terminals to the electronics module in place of the field terminals. Alternatively, the test signals can be supplied by separate test equipment.

In accordance with yet another aspect of the invention, the base members support communications buses which connect all of the electronics modules with a controller.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
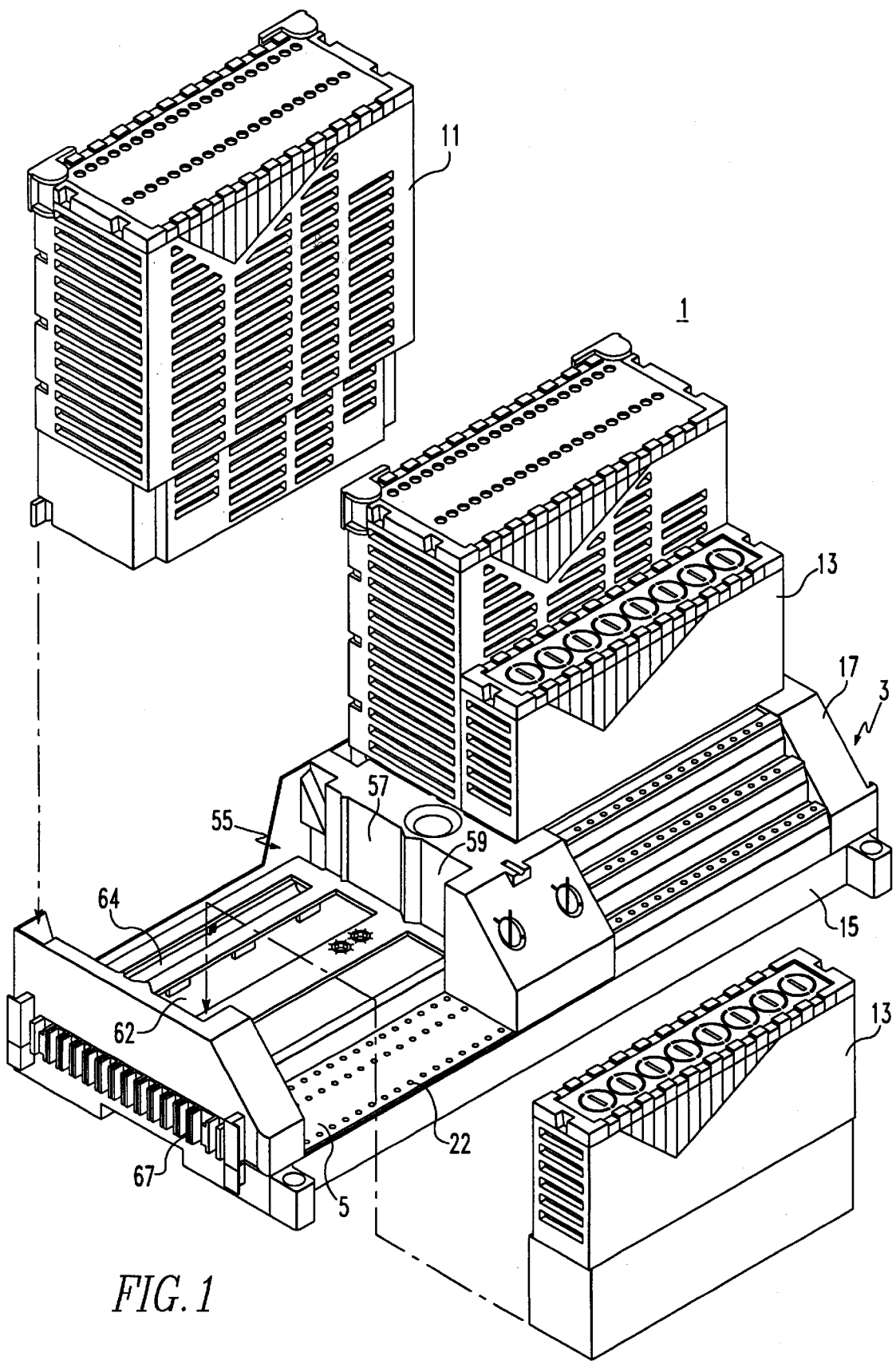
FIG. 1 is exploded isometric view of a modular I/O unit in accordance with the invention.
Figure 1A:
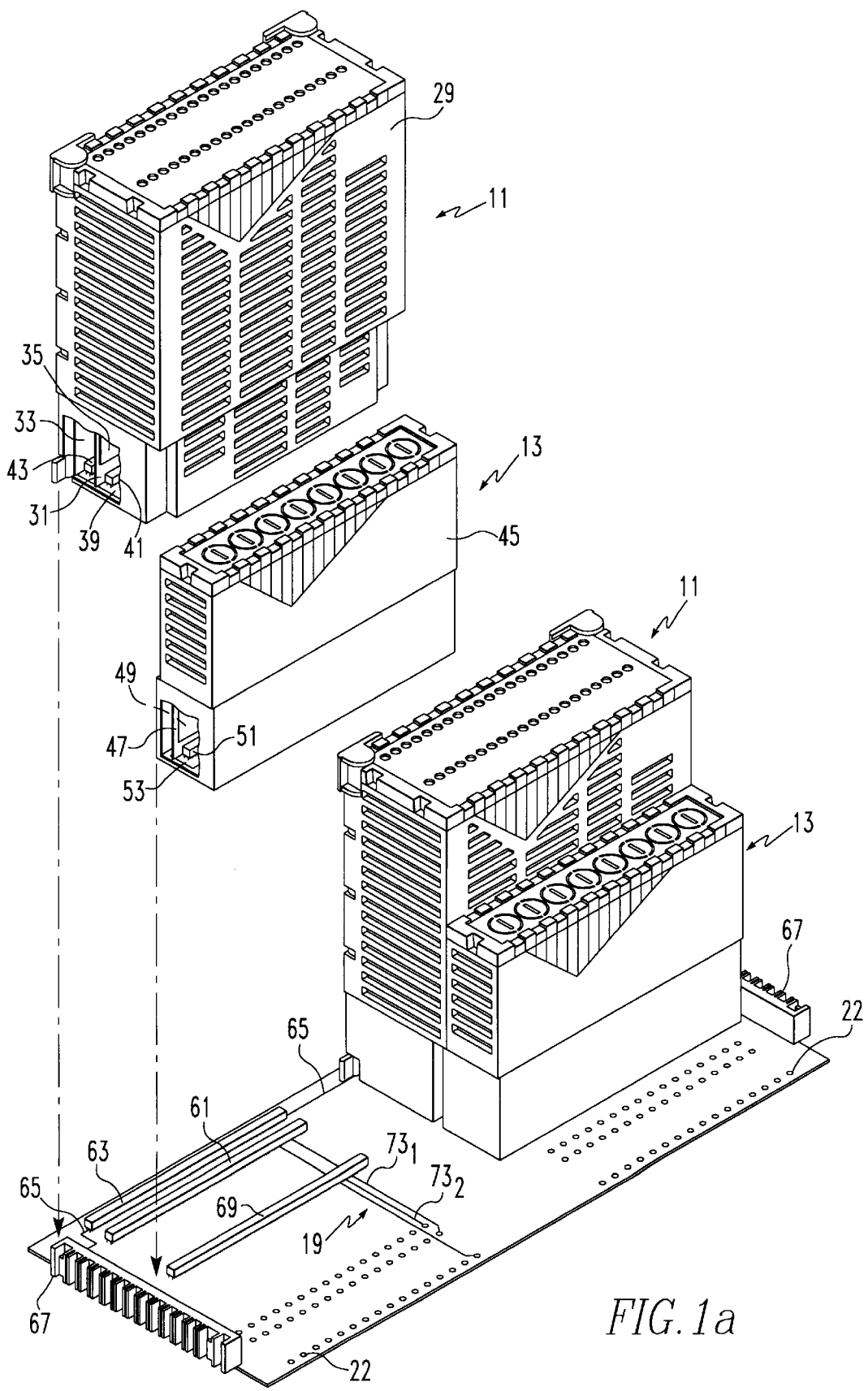
FIG. 1a is a partially exploded isometric view showing the interconnection of modules with a backplane within the modular I/O unit.
Figure 2:
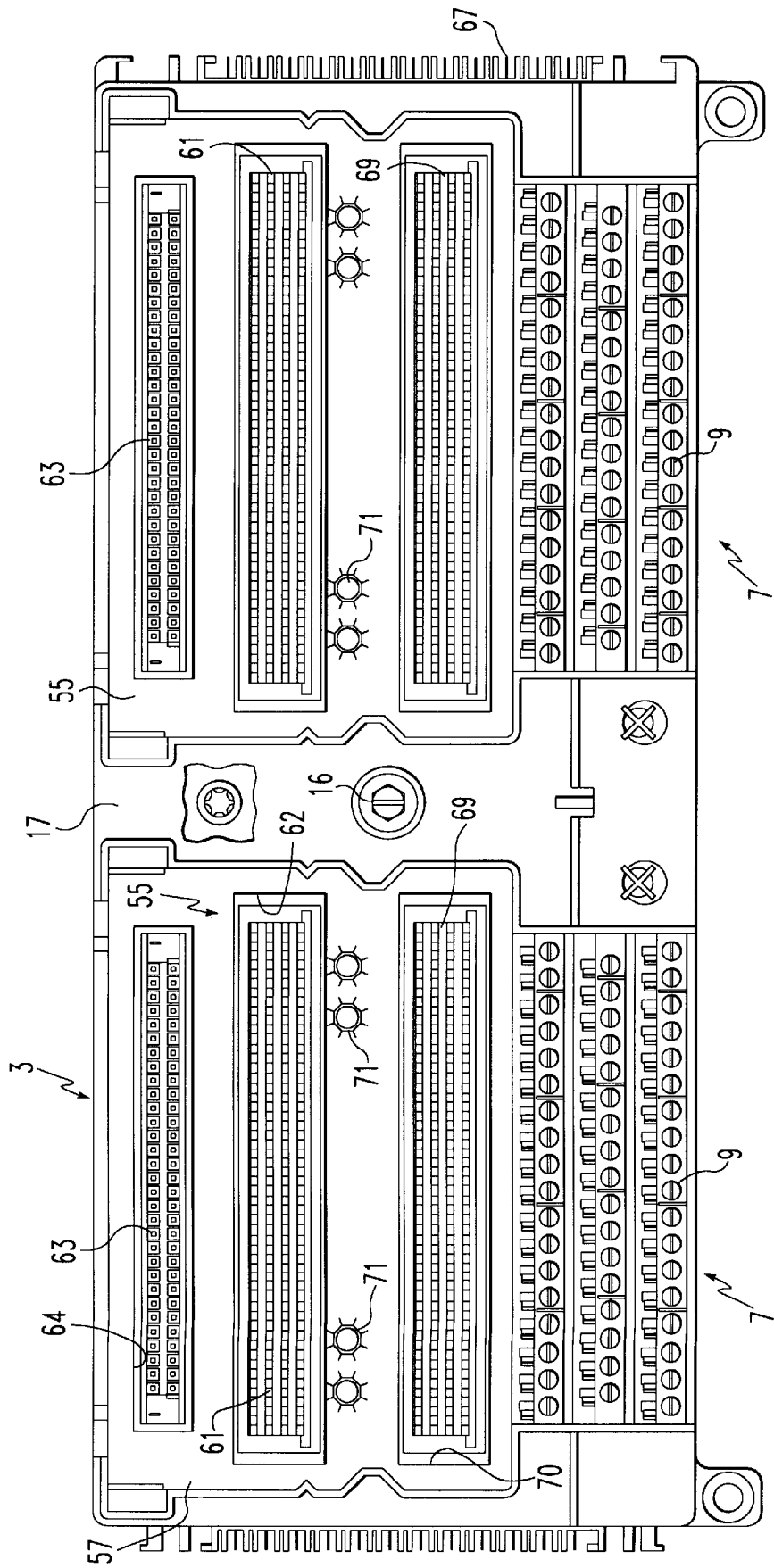
FIG. 2 is a top view of the housing of the modular I/O unit of FIG. 1 with the electronics and personality modules removed.
Figure 3:
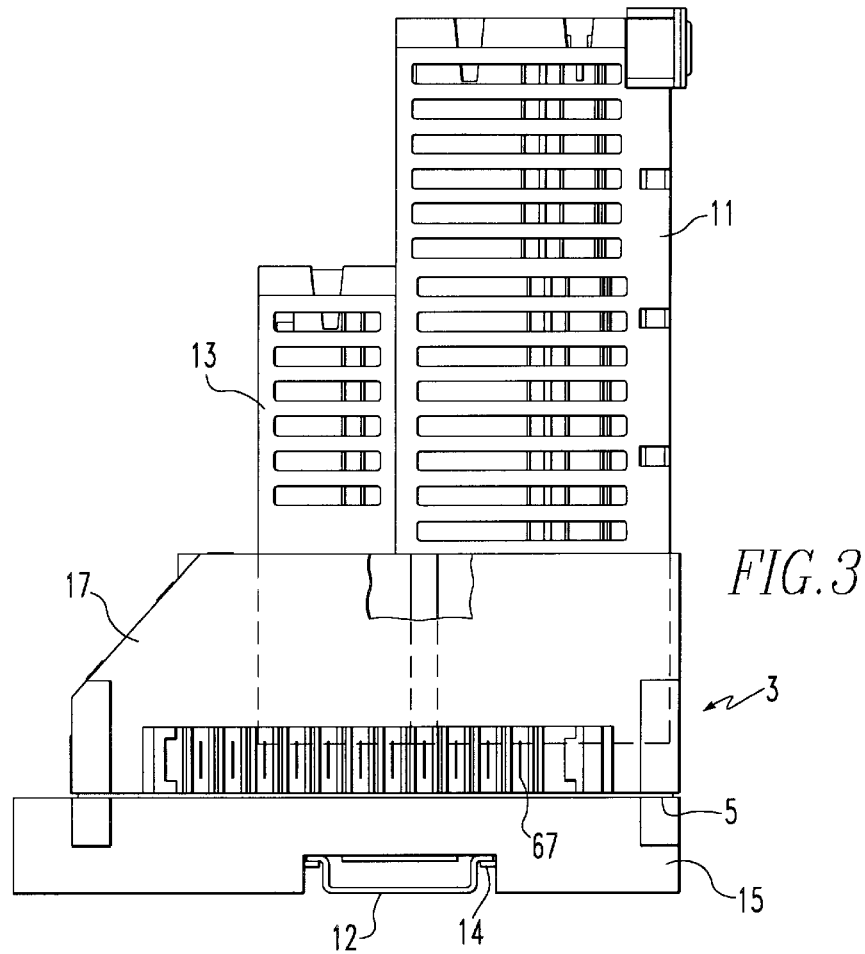
FIG. 3 is a side view of the I/O modular unit of FIG. 1 shown assembled.

Referring to FIGS. 1, 1a, 2 and 3, the modular input/output (I/O) system 1 of the invention includes as its basic components a base 3 in which a backplane 5 and a bank 7 of electrical terminals 9 are permanently mounted, and a pair of interchangeable electronics modules 11 and personality modules 13. Base 3 includes a bottom member 15 and top member 17 between which the backplane 5 is clamped. The backplane 5 has a pattern 19 of electrical conductors, to be described in more detail below, which selectively connect terminals 9 to the electronics modules 11 and personality module 13. In the system shown, the housing 3 supports dual arrangements of terminals 9, electronics modules 11 and personality modules 13. It will be understood that other arrangements could include a housing or base mounting a single set of a bank of terminals, an electronics module and a personality module, or three or more sets of these components. The base 3 is secured to a mounting rail 12 such as a standard DIN rail by a clamp 14, as seen in FIG. 3. This clamp is actuated by a screw 16 accessible through the top member 17 of the base, as shown in FIG. 2.

Figure 4:
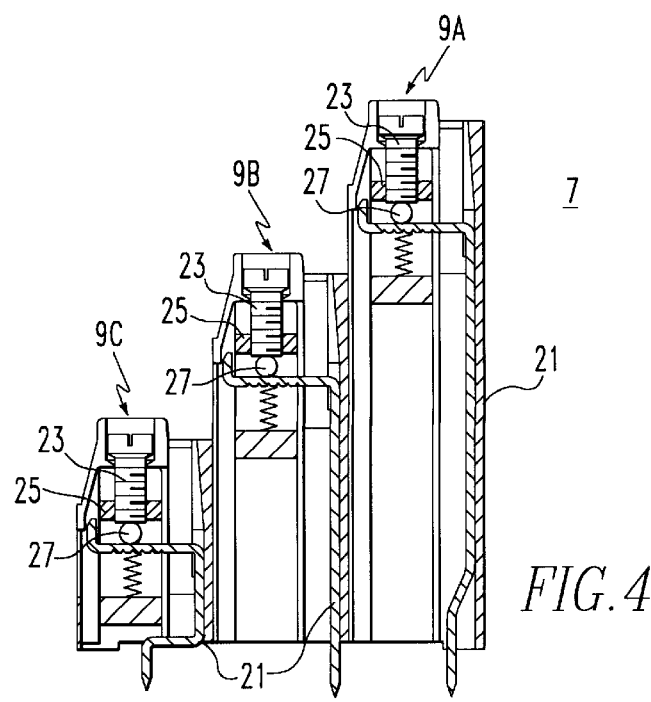
FIG. 4 is a sectional view through the terminals which form part of the modular I/O unit taken along the line 4—4 in FIG. 1.

The terminals 9 of each bank of terminals 7, are conveniently arranged in three tiers which can be labeled A, B and C for a three-phase electrical system. As shown in the cross-section of FIG. 4, each of the terminals includes a contact 21 which extends downward and terminates in a pointed end which engages holes ss (see FIGS. 1 and 1a) in the backplane 5 where it is connected to the circuitry 19. Terminal screws 23 engaged in clamps 25 secure the contacts 21 to field wiring 27.

The electronics module 11 includes a housing 29 in which are mounted a pair of circuit cards 31 and 33. The circuit card 31 contains the I/O signal processing circuitry 35. Depending upon the particular application, signal processing circuitry 35 performs one or more functions which can include filtering, amplification or attenuation, surge protection, isolation, range limiting or scaling, and pulse shaping or other signal conditioning. The second card 33 in the electronics module housing 29 is the communications card through which signals are transmitted between the signal conditioning circuitry 35 and the processing system for which the I/O is provided. Mounted on the signal processing card 31 and the communications card 33 adjacent an opening 39 in the bottom in the housing 29 are electrical connectors 41 and 43, respectively.

The personality module 13 is a switching module. It includes a housing 45 containing a circuit card 47 having switching circuitry 49, which as will be seen. can have a plurality of configurations. An electrical connector 51 is provided on the bottom edge of the circuit card 47 adjacent an opening 53 in the housing 45.

The top member 17 of the base 3 has an opening 55 which forms side-by-side sockets 57 and 59 for plug in of the electronics module 11 and personality or switching module 13, respectively. Mounted on the backplane 5 in alignment with the socket 57 are electrical connectors 61 and 63 which mate with the connectors 41 and 43 in the electronics module. The connector 61 electrically connects the signal processing card 31 with the I/O circuits 19 on the backplane while the connector 63 connects the communications circuitry on the communications card 33 with communication busses indicated at 65 on the backplane. Connectors 67 on each end of the backplane connect the communication busses 65 with adjacent I/O units 1 or a controller in a manner to be discussed. The connectors 67 and communications bus 65 provide power to the electronics module 11 in addition to routing signals to and from the modules.

In a similar manner, the connector 51 on the circuit card 47 of the personality or switching module 13 mates with a connector 69 on the backplane 5 to connect to the switching circuitry 49 with the circuits 19 as the personality module 13 is plugged into the socket 59. Preferably, octagonal keys on the backplane 5 assure that only an electronics module of a given type having a matching key (not shown) can be plugged into the socket 57.

Figure 5:
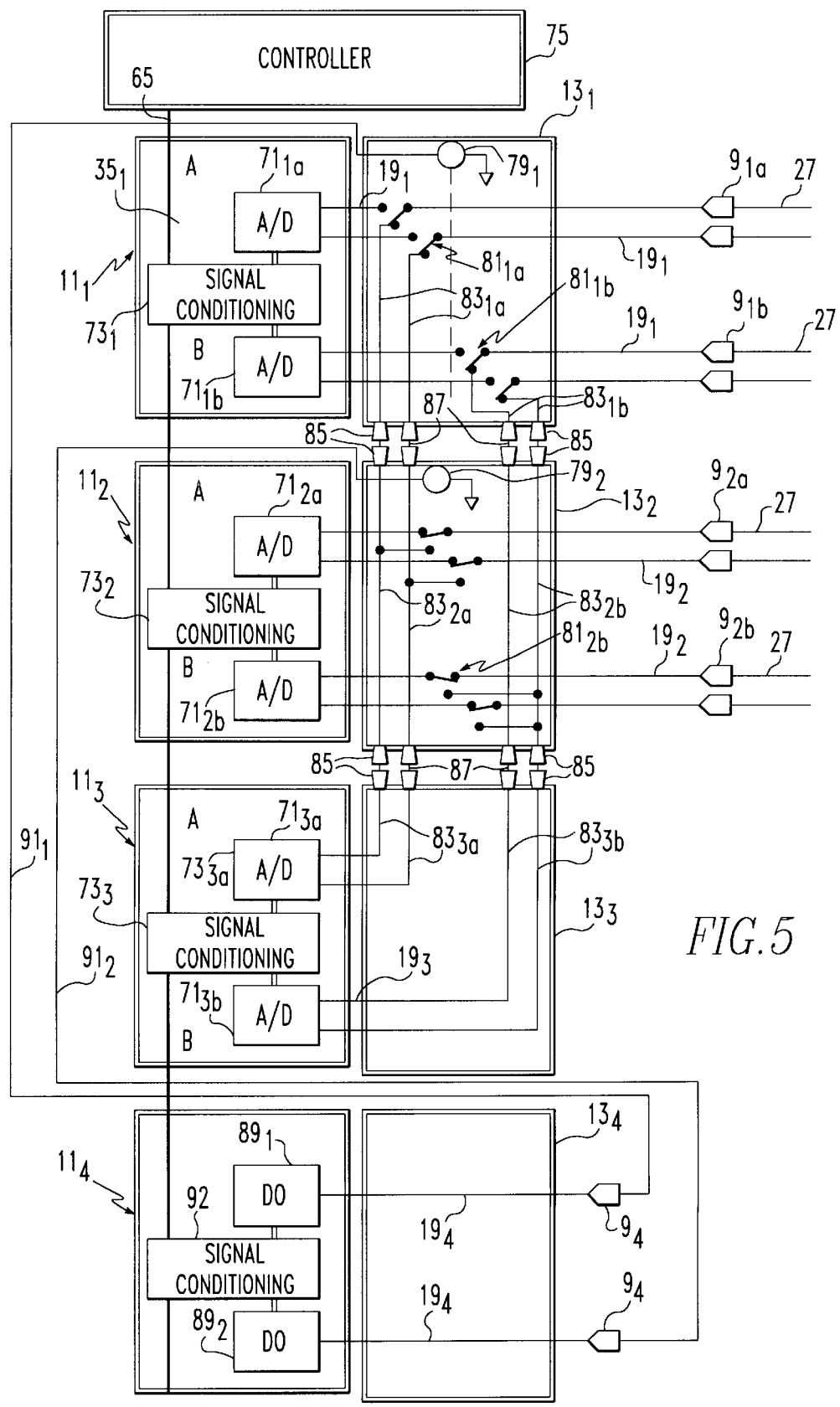
FIG. 5 is a schematic circuit diagram illustrating redundancy provided as one aspect of the invention.

FIG. 5 is a schematic diagram illustrating application of the invention to provide redundancy for the electronics modules 11. As shown in the example, the circuitry $35_1$ of electronics module $11_1$ has two channels A and B, each with an analog to digital (A/D) converter $71_{1a}$ and $71_{1b}$ connected through back plane circuitry $19_1$ and switching module $13_1$ to associated terminals $9_{1a}$ and $9_{1b}$ connected to the field wiring 27. The A/D converters 71 convert the analog field signals on the field wiring 27 into digital signals for input to signal conditioning circuits $73_1$ in the module $11_1$. The conditioned digital signals are transmitted to a controller 75 over communications bus 65.

The personality module $13_1$ includes switch $79_1$. The switch $79_1$ may be a relay as shown or solid state switching. The relay 79 has contacts $81_{1a}$ and $81_{1b}$ which in an unactuated position (not as shown in FIG. 5) connect the terminals $9_{1a}$ and $9_{1b}$ and the field wiring 27 to the associated electronics module $11_1$. When the relay $79_1$ is actuated, as shown FIG. 5, the contacts $81_{1a}$ and $81_{1b}$ connect the field wiring to leads $83_{1a}$ and $83_{1b}$ in the module $13_1$. The leads $83_{1a}$ and $83_{2b}$ are connected through terminals 85 to transfer leads 87, which are connected through similar terminals 85 to leads $83_{2a}$ and $83_{2b}$ in an adjacent personality module $13_2$. These leads $83_{2a}$ and $83_{2b}$ extend through the module $13_2$ and are connected through terminals 85 and additional transfer leads 87 to a third personality module $13_3$. The personality module $13_2$, also includes a switch $79_2$ which may be a solid state switch or, as shown, a relay. Contacts $81_{2a}$ and $81_{2b}$ of the relay $79_2$ are shown in their unactuated position in which they connect field wiring 27 through the associated terminals $9_{2a}$ and $92_{2b}$ to A/D converters $71_{2a}$ and $71_{2b}$ in the electronics module $11_2$. The third personality module $13_3$ which is connected to the third electronics module $11_3$ does not contain any switching but connects the transfer leads 87 through leads $83_{3a}$ and $83_{3b}$ to the backplane wiring 19 connected to the A/D converters $71_{3a}$ and $71_{3b}$ of the electronics module $11_3$.

A fourth electronics module $11_4$ serves as a control module which generates control signals for actuating the switches $79_1$ and $79_2$ in the switching or personality modules $13_1$ and $13_2$, respectively. The electronics module $11_4$ has digital output circuits DO $89_1$ and $89_2$ generating contact output signals which are passed by the circuity $19_4$ on the backplane to the associated terminals $9_4$. Control leads $91_1$ and $91_2$ are connected between these terminals $9_4$ and the switches $79_1$ and $79_2$. The personality module $13_4$ does not provide any switching. With neither of the switches $79_1$ or $79_2$ actuated, the electronics modules $11_1$ and $11_2$ are connected through the associated field terminals $9_1$ and $9_2$ to their assigned field wiring 27. Under these conditions, the redundant electronics module $11_3$ is in a stand-by status. If the controller 75 detects a malfunction in one of the electronics modules $11_1$ or $11_2$ or if it is desired to take one of these electronics modules out of service such as for maintenance or testing, a signal is transmitted over the communications bus 65 to the control electronics module $11_4$ to activate the appropriate digital output $89_1$ or $89_2$. For example, if the electronics module $11_1$ has failed in either channel, the DO $89_1$ is actuated to generate a control signal which energizes the switch $79_1$. This actuates the contacts $81_{1a} 81_{1b}$ to connect the terminals $9_{1a}$ and $91_{1b}$ and therefore the connected field wiring 27, to the leads $83_{1a}$ and $831_b$, which are passed through the terminals 85 and transfer leads 87 and by leads $82_{2a}$ and $83_{2b}$ through the switching module $13_2$ to the switching module $13_3$ where the signals are then connected to the redundant electronics module $11_3$ by the leads $83_{3a}$ and $83_{3b}$. Alternatively, if controller 75 detects that the electronics module $11_2$ has failed, the DO $892_b$ in the control module $11_4$ is actuated to generate a control signal which actuates the switch $79_2$ to connect the terminals $9_{2a}$ and $9_{2b}$ to the spare electronics module $11_3$ instead of the electronics module $11_2$. Only one of the switches $79_1$ and $79_2$ is energized at any one time.

If spare terminals 9 are available, the transfer leads 87 can be connected to the leads 83 through them, and the additional terminals 85 are not required. Furthermore, the redundant electronics modules such as the module $11_3$ can serve as a back-up for just one module $11_1$ for two electronics modules $11_1$ and $11_2$ as shown, or for any number of electronics modules 11.

Figure 6:
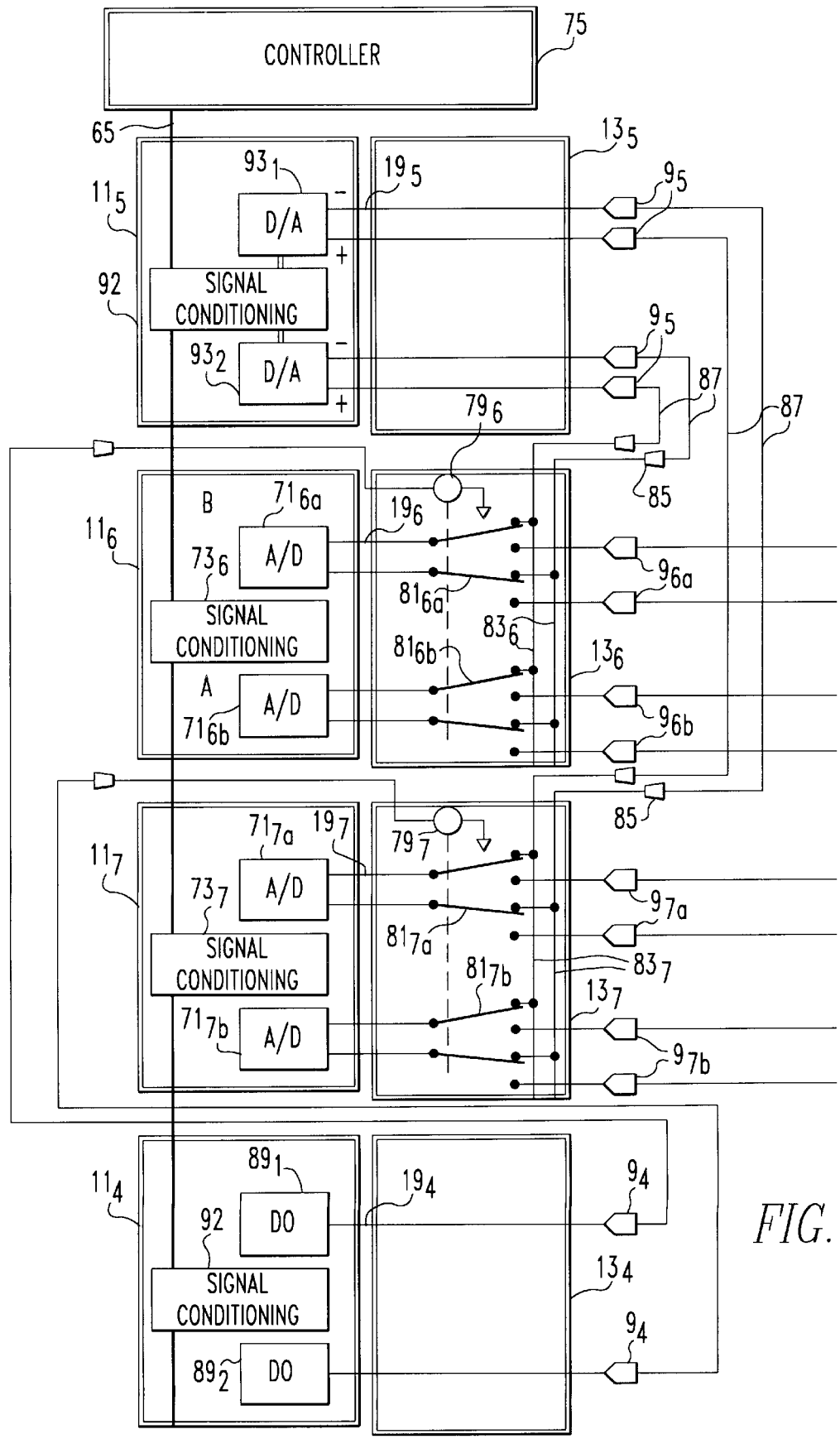
FIG. 6 is a schematic diagram illustrating implementation of a test function in accordance with another aspect of the invention.

FIG. 6 is a circuit diagram illustrating an application of the invention for implementing the test function. The electronics module $11_5$ serves as a test module which generates test signals under control from the controller 75 through communications bus 65. The digital test signals are received by receiving circuit 92 and are converted to analog signals in the digital to analog (D/A) converters $93_1$ and $93_2$ for the two channels of the module $11_5$. The personality module $13_5$ performs no switching functions so that the backplane circuits $19_5$ deliver the test signals to the terminals $9_5$. Transfer leads 87 provide the test signals to terminals 85 on the personality modules $13_6$ and $13_7$. The terminals 85 are connected to leads $83_6$ and $83_7$ in the switching modules $13_6$ and $13_7$, respectively. Switches $79_6$ and $79_7$, which again may be solid state switches or relays as shown, switch either the test signals on the leads $83_6$ and $86_7$ or field signals from the field wiring 27 provided through the terminals $9_6$ and $9_7$ and the backplane circuits $19_6$ and $19_7$. Thus, the contacts $81_{6a}$ and $81_{6b}$ apply the test signals to the A/D converters $71^{6a}$ and $71_{6b}$ of the electronics module $11_6$ when the switch $79_6$ is actuated. The test signals are processed by the signal processing circuits $73_6$ and returned to the controller 75 for analysis over the communications bus 65. Similarly, the contacts $81_{7a}$ and $81_{7b}$ apply the test signals to the appropriate channels of the electronics module $11_7$ when the corresponding switch $79_7$ is actuated.

The electronics module $11_4$ again serves as a control module which generates control signals through the DOs $89_1$ and $89_2$ when commanded by the controller 75. As in the case of the redundancy function, if sufficient terminals $9_6$ and $9_7$ are available, the transfer leads 87 can be connected to the switching modules $13_6$ and $13_7$ through these terminals and leads in the backplane $19_6$ and $19_7$, instead of through the separate connectors 85. Similarly, in the case of the redundancy function and the testing function, if sufficient terminals 9 are available, the control signals for the switches 79 can also be applied through these additional terminals and backplane wiring 19. In such a case, the switching module makes all the necessary connections through insertion in the socket in the base member.

Alternatively, separate test equipment can be used to supply the test signals which are selectively switched by the switches 79, or the switches 79 can be used to disconnect the field signals while test signals are injected through test points (not shown).

Figure 7:
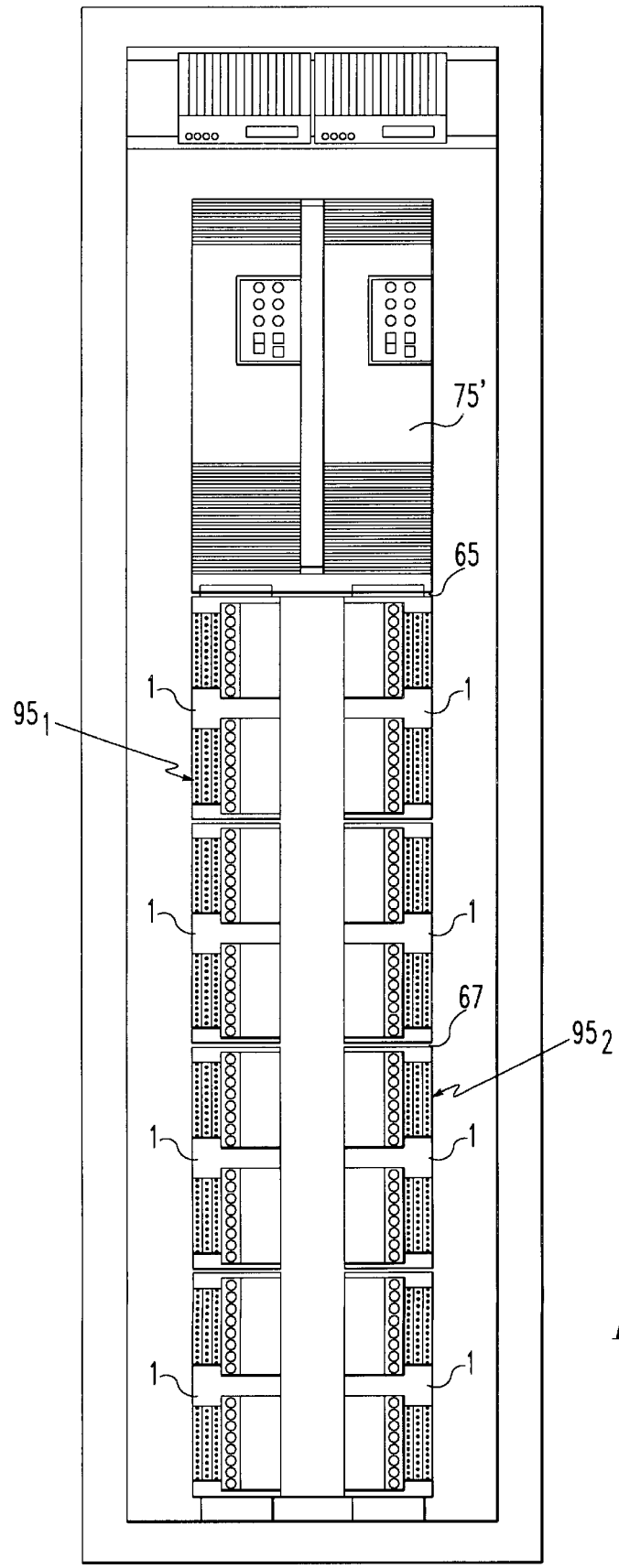
FIG. 7 is a front elevation view of a process control system incorporating a controller and a number of modular I/O units incorporating the invention.

As shown in FIG. 7, the modular I/O units 1 may be arranged in branches $95_1$ and $95_2$ which are connected to the controller such as the single/redundant controller 75'. The communications buses 65 and adjacent modular I/O units 1 are interconnected by the connectors 67 to connect each of modules to the controller 75'.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended claims and any and all equivalents thereof.

What is claimed is:

1. A modular I/O system for field wiring comprising:

base means;

a plurality of electronics modules mountable in said base means;

terminals associated with each electronics module including field terminals mounted on the base means for landing the field wiring:

electrical conductors on said base means connected to said electronics modules and said associated terminals;

a plug-in switching module associated with at least one of said electronics modules and having switch means connecting with said electrical conductors for effecting selectable connections between said at least one of said electronics modules and said terminals;

said at least one electronics module comprises a first electronics module and a second electronics module which is redundant to said first electronics module, transfer means connecting terminals associated with said first electronics module with said second electronics module, and said switching module being associated with said first electronics module selectively switching terminals associated with said first electronics module to which said field wiring is connected to said first electronics module and alternatively to said second, redundant electronics module through said transfer means; and said electronics modules comprise a plurality of said first electronics modules, said second electronics module being redundant to each of said plurality of first electronics modules, said transfer means comprising means connecting terminals associated with each of said first electronics modules to said second electronics module, each of said first electronics modules having an associated switching module selectively switching terminals associated with said first electronics module to the associated first electronics module and alternatively to said second electronics module through said transfer means.

2. The modular I/O system of claim 1 wherein said at least one electronics module has field terminals to which said field signals are applied and test inputs to which the test signals are applied, and said switching module associated with said at least one electronics module has switch means selectively connecting said at least one electronics module to said field terminals and alternatively to said test inputs.

3. The modular I/O system of claim 1 wherein said electronics modules include a third control electronics module generating control signals controlling said switching means of said switching modules so that associated terminals of only one of said first electronics modules is connected to said second electronics module at a time.

4. The modular I/O system of claim 3 wherein said base means comprises a plurality of base members, said base members having interconnected bus means connecting each of said electronics modules with control means.

5. A modular I/O system for field wiring comprising:

base means;

a plurality of electronics modules mountable in said base means;

terminals associated with each electronics module including field terminals mounted on the base means for landing the field wiring and receiving field signals:

electrical conductors on said base means connected to said electronics modules and said associated terminals;

a plug-in switching module associated with at least one of said electronics modules and having switch means connecting with said electrical conductors for effecting selectable connections between said at least one of said electronics modules and said terminals;

said electronics modules include a test electronics module for generating test signals, said at least one electronics module has field terminals to which said field signals are applied and test terminals to which the test signals are applied, and said switching module associated with said at least one electronics module has switch means selectively connecting said at least one electronics module to said field terminals and alternatively to said test terminals; and said electronics modules include a plurality of said at least one electronics module having switch means, each having associated field terminals and test terminals and an associated switching module selectively switching the associated at least one electronics module to said associated field terminals and alternatively to said associated test terminals.

6. The modular I/O system of claim 5 wherein said electronics modules include a control electronics module generating a control signal controlling selective switching of said switch means of said switching modules.

7. The modular I/O system of claim 6 wherein said base means comprises of a plurality of base members and interconnected communication buses on said base member connecting said electronics modules to a controller.

* * * * *